United States Patent [19]
Nakano et al.

[11] Patent Number: 5,551,071
[45] Date of Patent: Aug. 27, 1996

[54] CHANNEL SORTING SCANNING RECEIVER

[75] Inventors: Yasuyoshi Nakano, Kashiwa, Japan;
 Seiji Harada, Colleyville, Tex.

[73] Assignees: Uniden Corp., Ichikawa, Japan;
 Uniden America Corporation, Fort Worth, Tex.

[21] Appl. No.: 196,427

[22] Filed: Feb. 15, 1994

[51] Int. Cl.$^6$ .................................................. H04B 1/18
[52] U.S. Cl. ............................ 455/161.2; 455/166.2; 455/186.1
[58] Field of Search .................. 455/75, 76, 161.1, 455/161.2, 165.1, 179.1, 183.1, 184.1, 185.1, 186.1, 186.2, 166.1, 166.2

[56] References Cited

U.S. PATENT DOCUMENTS

| | | |
|---|---|---|
| 3,965,336 | 6/1976 | Grohmann . |
| 4,218,773 | 8/1980 | Imamura . |
| 4,271,532 | 6/1981 | Wine . |
| 4,282,603 | 8/1981 | Sato ........................................ 455/184.1 |
| 4,355,416 | 10/1982 | Malerba . |
| 4,509,203 | 4/1985 | Yamada . |
| 4,521,915 | 6/1985 | Baker et al. . |
| 4,525,866 | 6/1985 | Templin . |
| 4,688,261 | 8/1987 | Killoway et al. . |
| 4,833,728 | 5/1989 | Kimura et al. . |
| 4,860,380 | 8/1989 | Mengel . |
| 4,901,036 | 2/1990 | Herold et al. . |
| 4,947,456 | 8/1990 | Atkinson et al. . |
| 5,014,348 | 5/1991 | Boone et al. . |
| 5,163,161 | 11/1992 | Bowles et al. . |
| 5,357,285 | 10/1994 | Sanya et al. ........................... 455/186.2 |

FOREIGN PATENT DOCUMENTS 2073492 2/1992 Japan .

*Primary Examiner*—Andrew Faile
*Assistant Examiner*—Thanh Le
*Attorney, Agent, or Firm*—Daniel R. Brown

[57] ABSTRACT

A scan receiving system comprising an antenna circuit, a radio-frequency reception circuit connected to the antenna circuit and for converting a received radio-frequency signal into an audio-frequency signal, an audio-frequency circuit connected to the radio-frequency reception circuit and for amplifying the audio-frequency signal supplied from the radio-frequency reception circuit, an input circuit for inputting a desired reception frequency, and a controller connected to the radio-frequency reception circuit, the audio-frequency circuit and the input circuit, the controller including a plurality of channel memories which are provided in one-to-one correspondence with a plurality of carrier frequency channels so that a plurality of desired reception frequencies inputted through the input circuit are programmed in the plurality of channel memories, the frequencies programmed in the plurality of channel memories being scanned in the order of frequency ascending or descending in accordance with a scan instruction inputted through the input circuit to perform tuning to a reception signal in the radio-frequency reception circuit by successively using the programmed frequencies as reference values to thereby perform reception of a signal from a desired station.

8 Claims, 8 Drawing Sheets

FIG. 1

| BANK | CHANNEL No. |
|---|---|
| BANK 1 | CH1, CH2, CH3, CH4, CH5 CH6, CH7, CH8, CH9, CH10 |
| BANK 2 | CH11, CH12, CH13, CH14, CH15 CH16, CH17, CH18, CH19, CH20 |
| BANK 3 | CH21, CH22, CH23, CH24, CH25 CH26, CH27, CH28, CH29, CH30 |
| BANK 4 | CH31, CH32, CH33, CH34, CH35 CH36, CH37, CH38, CH39, CH40 |
| BANK 5 | CH41, CH42, CH43, CH44, CH45 CH46, CH47, CH48, CH49, CH50 |
| BANK 6 | CH51, CH52, CH53, CH54, CH55 CH56, CH57, CH58, CH59, CH60 |
| BANK 7 | CH61, CH62, CH63, CH64, CH65 CH66, CH67, CH68, CH69, CH70 |
| BANK 8 | CH71, CH72, CH73, CH74, CH75 CH76, CH77, CH78, CH79, CH80 |
| BANK 9 | CH81, CH82, CH83, CH84, CH85 CH86, CH87, CH88, CH89, CH90 |
| BANK 10 | CH91, CH92, CH93, CH94, CH95 CH96, CH97, CH98, CH99, CH100 |

FIG. 2

| CHANNEL | FREQUENCY | SCAN ORDER |
|---|---|---|
| CH 1 | 25.500 MHz | 2 |
| CH 2 | 25.000 MHz | 1 |
| CH 3 | 27.850 MHz | 3 |
| CH 4 | 55.870 MHz | 5 |
| CH 5 | 32.780 MHz | 4 |
| CH 6 | 60.660 MHz | 6 |
| CH 7 | 120.340 MHz | 10 |
| CH 8 | 80.860 MHz | 8 |
| CH 9 | 102.440 MHz | 9 |
| CH 10 | 65.120 MHz | 7 |

FIG. 3

| BANK | CONVENTIONAL CASE | THE INVENTION |
|---|---|---|
| BANK 1 | CH1→CH2→CH3→CH4→CH5<br>CH6→CH7→CH8→CH9→CH10 | CH2→CH1 →CH3→CH5→CH4<br>CH6→CH10→CH8→CH9→CH7 |
| BANK 2 | CH11→CH12→CH13→CH14→CH15<br>CH16→CH17→CH18→CH19→CH20 | CH20→CH17→CH13→CH18→CH15<br>CH16→CH12→CH14→CH19→CH10 |
| BANK 3 | CH21→CH22→CH23→CH24→CH25<br>CH26→CH27→CH28→CH29→CH30 | CH23→CH22→CH24→CH21→CH25<br>CH30→CH26→CH28→CH27→CH29 |
| BANK 4 | CH31→CH32→CH33→CH34→CH35<br>CH36→CH37→CH38→CH39→CH40 | CH31→CH37→CH38→CH39→CH35<br>CH36→CH34→CH33→CH32→CH40 |
| ... | ... | ... |
| BANK 10 | CH91→CH92→CH93→CH94→CH95<br>CH96→CH97→CH98→CH99→CH100 | CH94→CH97→CH99→CH96→CH95<br>CH98→CH92→CH91→CH93→CH100 |

FIG. 8

CH MEMORY

| CH | Frequency |
|---|---|
| CH 1 | 30.960 MHz |
| CH 2 | 25.500 MHz |
| CH 3 | 29.580 MHz |
| CH 4 | 27.620 MHz |
| CH 5 | 50.230 MHz |
| CH 6 | 55.250 MHz |
| CH 7 | 59.200 MHz |
| CH 8 | 65.250 MHz |
| CH 9 | 80.000 MHz |
| CH 10 | 100.560 MHz |

FIG. 9

SORT BUFFER

| |
|---|
| CH 2 |
| CH 4 |
| CH 3 |
| CH 1 ← SCAN POINTER |
| CH 5 |
| CH 6 |
| CH 7 |
| CH 8 |
| CH 9 |
| CH 10 |

FIG. 13

CH MEMORY

| | |
|---|---|
| CH 1 | 30.960 MHz |
| CH 2 | 25.500 MHz |
| CH 3 | 29.580 MHz |
| CH 4 | 27.620 MHz |
| CH 5 | 50.230 MHz |
| CH 6 | 55.250 MHz |
| CH 7 | 59.200 MHz |
| CH 8 | 65.250 MHz |
| CH 9 | 80.000 MHz |
| CH 10 | 100.660 MHz |

FIG. 14

SORT BUFFER

| BANK 1 | BANK 2 |
|---|---|
| CH 2 | CH 15 |
| CH 4 | CH 17 |
| CH 3 | CH 20 |
| CH 1 | CH 16 |
| CH 5 | CH 18 |
| CH 6 | CH 13 |
| CH 7 | CH 14 |
| CH 8 | CH 12 |
| CH 9 | CH 11 |
| CH 10 | CH 19 |

← SCAN POINTER

CHANNEL SORTING SCANNING RECEIVER

BACKGROUND OF THE INVENTION

1. Field of the Invention

The present invention relates to a radio equipment, and more particularly to scanning receiver systems in such radio equipment.

2. Related Art

Radio communication systems for performing radio communication with a partner by using a predetermined channel selected from a plurality of carrier frequency channels are widely used.

Heretofore, in a radio communication system of such a type, a plurality of carrier frequency channels are provided in one-to-one correspondence with a plurality of memories which are arranged in one bank or arranged separately in a plurality of banks so that channel scanning is carried out in the order of the channel numbers in each bank.

Conventionally, therefore, the channel scanning speed is determined on the basis of PLL lock-up time (the time required for settling down a PLL unit to an altered frequency) and squelch response time (the time required for detecting a reception signal after alteration of the frequency). Particularly in the case where the change in frequency is relatively large, a long PLL lock-up time is required. In a radio communication system of such a type, it is therefore desirable that the PLL lock-up time is shortened as much as possible at the time of channel scanning, in order to maximize the channel scanning speed.

SUMMARY OF THE INVENTION

It is therefore an object of the present invention to provide a scan receiving system in which the PLL lock-up time can be shortened at the time of channel scanning.

The foregoing object of the present invention is achieved by a scan receiving system comprising an antenna circuit, a radio-frequency reception circuit connected to the antenna circuit and for converting a received radio-frequency signal into an audio-frequency signal, an audio-frequency circuit connected to the radio-frequency reception circuit and for amplifying the audio-frequency signal supplied from the radio-frequency reception circuit, an input circuit for inputting a desired reception frequency, and a controller connected to the radio-frequency reception circuit, the audio-frequency circuit and the input circuit, wherein the controller includes a plurality of channel memories which are provided in one-to-one correspondence with a plurality of carrier frequency channels so that a plurality of desired reception frequencies inputted through the input circuit are programmed in the plurality of channel memories, and frequencies programmed in the plurality of channel memories are scanned in the order of frequency ascending or descending in accordance with a scan instruction inputted through the input circuit to perform tuning to a reception signal in the radio-frequency reception circuit by successively using the programmed frequencies as reference values to thereby perform reception of a signal from a desired station. That is, the change in frequency at the time of channel scanning can be reduced to a minimum by the aforementioned configuration, so that the PLL lock-up time can be shortened, and the channel scanning speed maximized.

BRIEF DESCRIPTION OF THE DRAWINGS

FIG. 1 shows an example of separation of a plurality of channels into a plurality of banks, in which example 100 channels are separated into 10 banks;

FIG. 2 is a view showing an example of the contents of programs in the respective channel memories in BANK 1 depicted in FIG. 1;

FIG. 3 shows channel scanning sequences in respective banks in comparison between the conventional case and the case according to the present invention;

FIG. 8 shows an example of data stored in the channel memory 36 depicted in FIG. 5;

FIG. 9 shows an example of data stored in the sort buffer 38 depicted in FIG. 5;

FIG. 13 shows an example of data stored in the channel memory 36 depicted in FIG. 10; and FIG. 14 shows an example of data stored in the sort buffer 38 depicted in FIG. 10.

PREFERRED EMBODIMENTS OF THE INVENTION

FIG. 1 shows an example in which 100 carrier frequency channels CH1 to CH100 having one-to-one correspondence with 100 channel memories are separated into 10 banks, BANK 1 to BANK 10, so that 10 channels belong to each bank. That is, a group of channels CH1 to CH10, a group of channels CH11 to CH20, . . . , and a group of channels CH91 to CH100 belong to the respective banks BANK 1, BANK 2, . . . , and BANK 10.

In the case where, for example, 100 channels are provided and separated into 10 banks as described above, conventional channel scanning is carried out in the ascending (or descending) order of the bank number and in the ascending (or descending) order of the channel number in each bank, or in other words, conventional channel scanning is carried out in the ascending (or descending) order of the channel number, for example, in the order of CH1, CH2, CH3, . . . , CH98, CH99 and CH100 while the whole is regarded as one bank. Necessary frequencies are however programmed in the respective channels at random so that the order of channel numbers is different from the order of frequencies allocated to the respective channels. Accordingly, when these channels are scanned in the order of channel number, the change in frequency in the channel scanning period becomes very large because the frequency spacing between adjacent channels is random. As a result, there arises a defect that a large PLL lock-up time is required.

According to the present invention, a plurality of carrier frequency channels provided in one-to-one correspondence with a plurality of memories are separated into a plurality of banks so that channel scanning is carried out in the order of bank number and in the ascending (or descending) order of the frequencies programmed in the respective channel memories in each bank.

FIG. 2 shows an example of the data programmed in channel memories in BANK 1. In this example, conventional channel scanning is carried out in the ascending order of the channel numbers, that is, in the order of CH1 CH2 CH3, ... CH8 CH9 CH10, whereas the channel scanning according to the present invention is carried out in the ascending order of the frequencies programmed in the respective channel memories, that is, in the order of CH2 CH1 CH3 CH5 CH4 CH6 CH10 CH8 CH9 CH7. FIG. 3 shows an example of channel scanning sequences in respective banks in comparison between the conventional case and the case according to the present invention.

Figure 4:
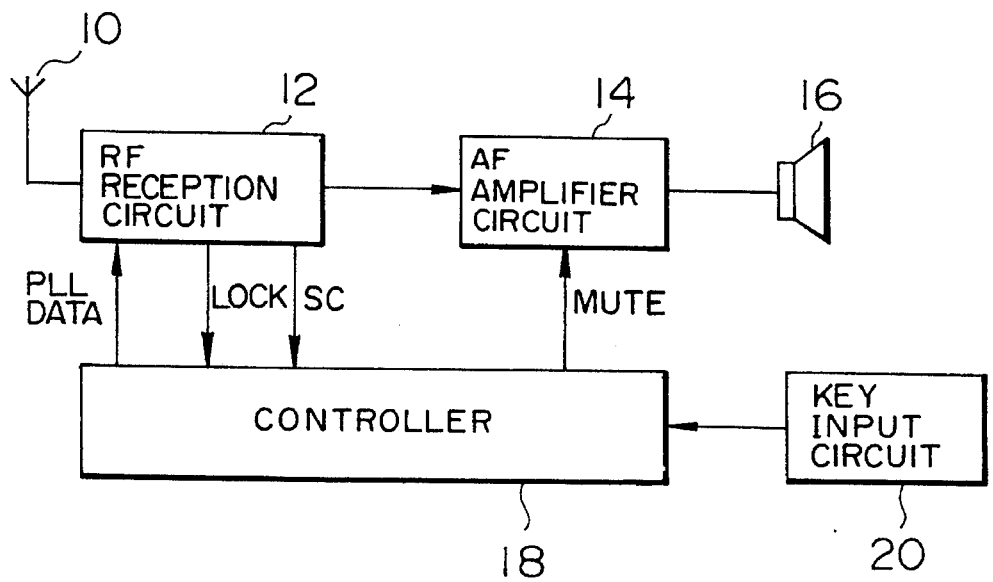
FIG. 4 is a block diagram showing an embodiment of the scan receiving system according to the present invention.

FIG. 4 is a block diagram showing an embodiment of the scan receiving system according to the present invention. In this drawing, the reference numeral 10 designates a reception antenna; 12, a radio-frequency reception circuit (hereinafter referred to as "RF reception circuit"); 14, an audio-frequency amplifier circuit (hereinafter referred to as "AF amplifier circuit"); 16, a speaker; 18, a controller; and 20, a key input circuit. The RF reception circuit 12 is a circuit for converting a radio-frequency frequency-modulated signal (hereinafter referred to as "RF signal") received through the antenna 10 into an audio-frequency signal (hereinafter referred to as "AF signal") and for supplying the AF signal to the AF amplifier circuit 14. The AF amplifier circuit 14 is a circuit for amplifying the AF signal so as to drive the speaker 16. Description of these circuits 12 and 14 will be omitted because conventionally known circuits are used as these circuits 12 and 14. The RF reception circuit 12 includes a squelch circuit (not shown) which is used for muting noise automatically when there is no carrier received. When there is no carrier received, the RF reception circuit 12 supplies a squelch control signal (hereinafter referred to as "SC signal") to the controller 18. As known well, the RF reception circuit 12 further includes a phase-locked loop (hereinafter referred to as "PLL") for performing phase detection on the basis of the signal received through the antenna circuit 10 and a reference frequency signal "PLL DATA" supplied from the controller 18 and for continuously supplying the controller 18 with a lock signal "LOCK" indicating whether PLL is locked up or not. The controller 18 includes a plurality of memories (not shown) which are provided in one-to-one correspondence with a plurality of carrier frequency channels. The controller 18 scans the plurality of carrier frequency channels in the ascending order of the frequencies in accordance with a desired reception frequency inputted through the key input circuit 20, generates the aforementioned signal "PLL DATA" and performs reception of a signal from a desired station. The controller 18 supplies the AF amplifier circuit 14 with a muting signal "MUTE" which is turned on to thereby cut off the AF amplifier circuit 14 so that noise is not amplified when the RF reception circuit 12 is not tuned to a certain reception frequency.

Figure 5:
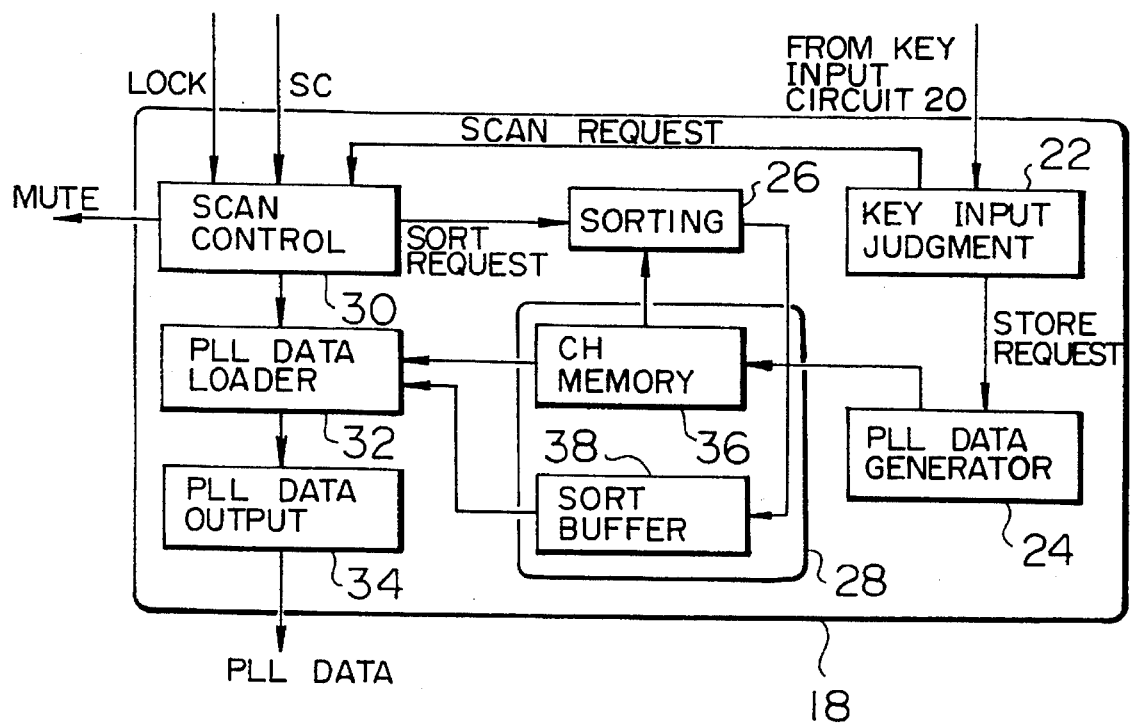
FIG. 5 is a block diagram showing an embodiment of the controller 18 of the scan receiving system depicted in FIG. 4.

FIG. 5 is a block diagram showing an embodiment of the controller 18. As shown in the drawing, the controller 18 is constituted by a key input judgment means 22, a PLL data generator means 24, a sorting means 26, a memory means 28, a scan control means 30, a PLL data loader means 32 and a PLL data output means 34. The memory means 28 is constituted by channel memories 36 and a sort buffer 38. In this embodiment, whenever a bank as a subject of scanning is changed for a new one in a scanning period, frequencies in the new bank are sorted.

Figure 6:
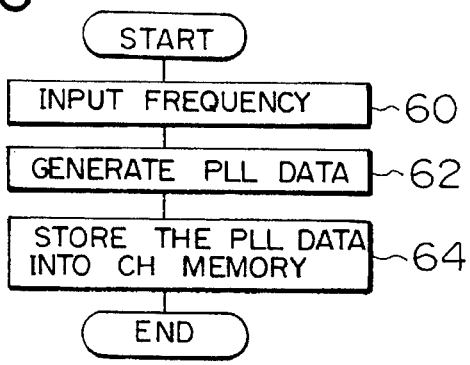
FIG. 6 is a flow chart showing the routine of registering PLL data into the channel memory 36 depicted in FIG. 5.
Figure 7:
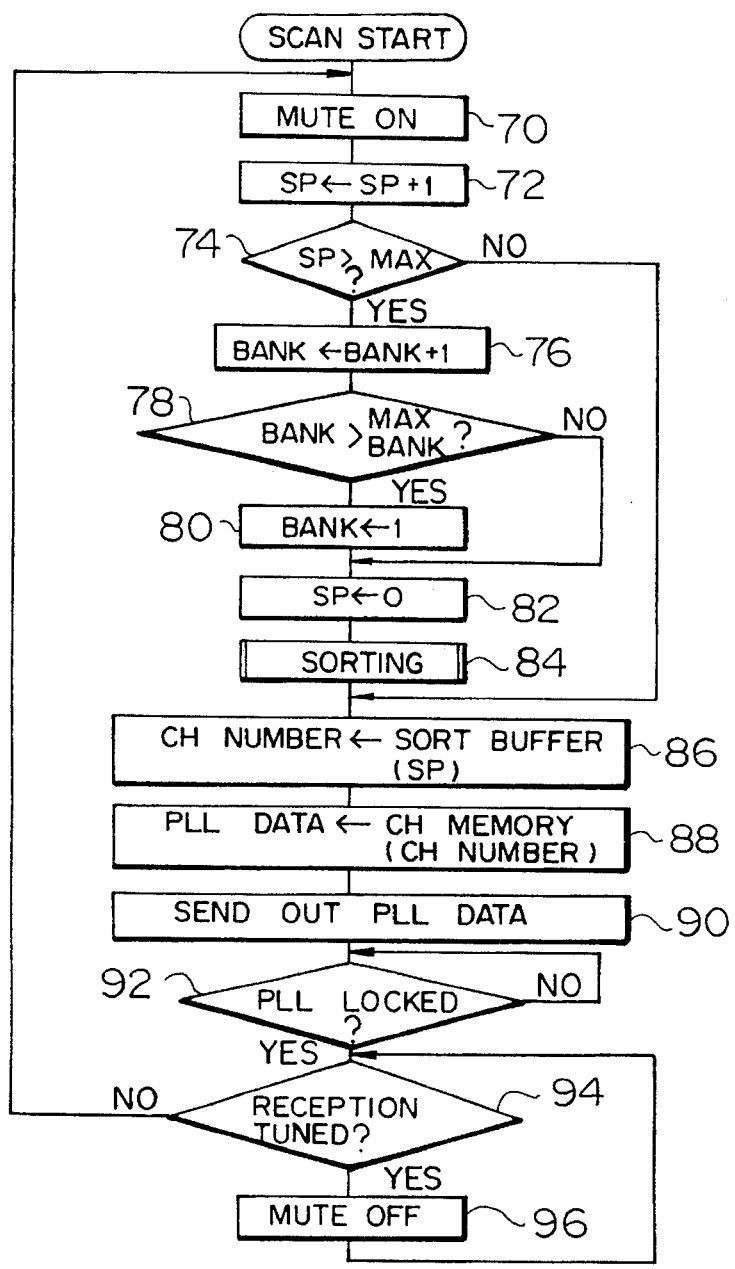
FIG. 7 is a flow chart showing the scanning operation in FIG. 5.

Referring to FIGS. 6, 7, 8 and 9, the operations of the respective constituent means of the controller 18 will be described below in detail. FIG. 6 is a flow chart showing the routine of registering a frequency in corresponding one of the channel memories 36. FIG. 7 is a flow chart showing the scanning operation. FIG. 8 shows an example of data stored in the channel memories 36. FIG. 9 shows an example of data stored in the sort buffer 38.

(A) When a desired frequency is inputted through the key input circuit 20, the frequency registering routine shown in FIG. 6 starts (step 60). The key input judgment means 22 judges whether the inputted frequency can be registered in one of the channel memories 36 or not. When a decision is made so that the inputted frequency can be registered, PLL data corresponding to the inputted frequency is generated by the PLL data generator means 24 (step 62) and registered in one of the channel memories 36 corresponding to a vacant channel (step 64). Thus, the frequency registering routine is terminated.

(B) When a scan start instruction is then inputted through the key input circuit 20, the scanning operation routine shown in FIG. 7 starts. A scan request signal is transmitted from the key input judgment means 22 to the scan control means 30, so that the scanning operation starts.

(C) When the scanning operation starts, the scan control means 30 supplies a MUTE signal to the AF amplifier circuit 14 (FIG. 4) (step 70) to stop the audio output of the AF amplifier circuit 14. Then, the scan control means 30 increases the scan pointer (FIG. 9) by one point (step 72). In this occasion, a judgment is made as to whether the scan pointer is larger than its maximum (for example, 10 in the case of a system having 10 channels in every bank) or not (step 74). When the scan pointer is larger than the maximum, the bank number to be scanned is increased by one point (step 76) because scanning of all the channels in the current bank is completed. In this occasion, a judgment is made as to whether the bank number exceeds its maximum or not (step 78). When the result of the judgment is YES, the bank number is initialized to BANK 1 (step 80) and then the scan pointer is initialized (step 82). When the result of the judgment in the step 78 is NO, the situation of the routine skips over the step 80 of bank number initialization to the step 82 of scan pointer initialization. Here, the scan control means 30 supplies a sort request signal to the sorting means 26 so that the operation is shifted to the following paragraph (D) (sorting 84 in FIG. 7). When the result of the judgment in the step 74 is NO, the scan control means 30 also supplies a sort request signal to the sorting means 26 so that the operation is shifted to the paragraph (E).

(D) When a sort request signal is given, the sorting means 26 rearranges all channels belonging to the bank subjected to increment (that is, the bank next to the currently scanned bank) in the ascending order of frequencies and sets channel numbers in the sort buffer 38 in the order rearranged (step 84). That is, as a result of sorting of channel numbers CH1 to CH10 registered in the channel memories 36 in random frequency sequence shown in FIG. 8, channel numbers are registered in the sort buffer 38 in frequency sequence shown in FIG. 9, that is, in the order of CH2 CH4 CH3 CH1 CH5 CH6 CH7 CH8 CH9 CH10.

(E) Then, the PLL data loader means 32 searches the sort buffer 38 for the channel number designated by the sort pointer (step 86) and loads the "PLL DATA" registered in the channel memory 36 corresponding to the channel number (step 88). The PLL data loaded in the PLL data loader means 32 is supplied to the RF reception circuit 12 (FIG. 4) through the PLL data output means 34 (step 90).

(F) A signal "LOCK" indicating the lock state of the PLL is continuously supplied from the RF reception circuit 12 (FIG. 4) to the scan control means 30, so that a judgment can be made on the basis of the signal "LOCK" as to whether the PLL is locked or not (step 92).

(G) When the information that the PLL is locked is given by the signal "LOCK", the scan control means 30 detects the SC signal supplied from the RF reception circuit 12 (FIG. 4) and judges based on the SC signal whether reception is tuned to the reception reference frequency designated by the "PLL DATA" supplied to the PLL (step 94). When the information that reception is tuned is given by the SC signal, the scan control means 30 turns off the "MUTE" signal supplied to the AF amplifier circuit 14 (FIG. 4) so that the reception audio signal is outputted from the AF amplifier circuit 14 (step 96).

(H) When reception is not tuned to the reception reference frequency, the operation goes back to the step 70 in which the "MUTE" signal supplied to the AF amplifier circuit 14 (FIG. 4) is turned on so that the audio output is stopped. Thereafter, the scan pointer is increased by one point (step 72). If the scan pointer in this occasion is larger than the aforementioned maximum (step 74), the bank number to be subjected to scanning is increased by one (step 76) and then the scan pointer is initialized (step 82). Thereafter, the situation of the routine goes back to the aforementioned item (D). When the scan pointer is smaller than the maximum (step 74), the situation of the routine goes back to the aforementioned paragraph (E).

Thereafter, by repeating a series of operations expressed by the items (D) to (H), all the channels belonging to each bank can be scanned in the ascending order of the frequencies.

The respective devices in the configuration of FIG. 5 may be constituted separately or may be provided in the form of a micro-computer.

This embodiment has the following advantages. That is, because scanning is carried out while oscillation frequencies of a VCO (voltage-controlled oscillator, not shown) are sorted in the ascending order of frequencies, the following advantages are achieved:

1. Channel numbers programmed by the user do not change at the time of sorting;
2. Scanning speed is improved; and
3. The memories necessary for sorting are only memories for one bank, so that the efficiency of use of memory is attained.

Figure 10:
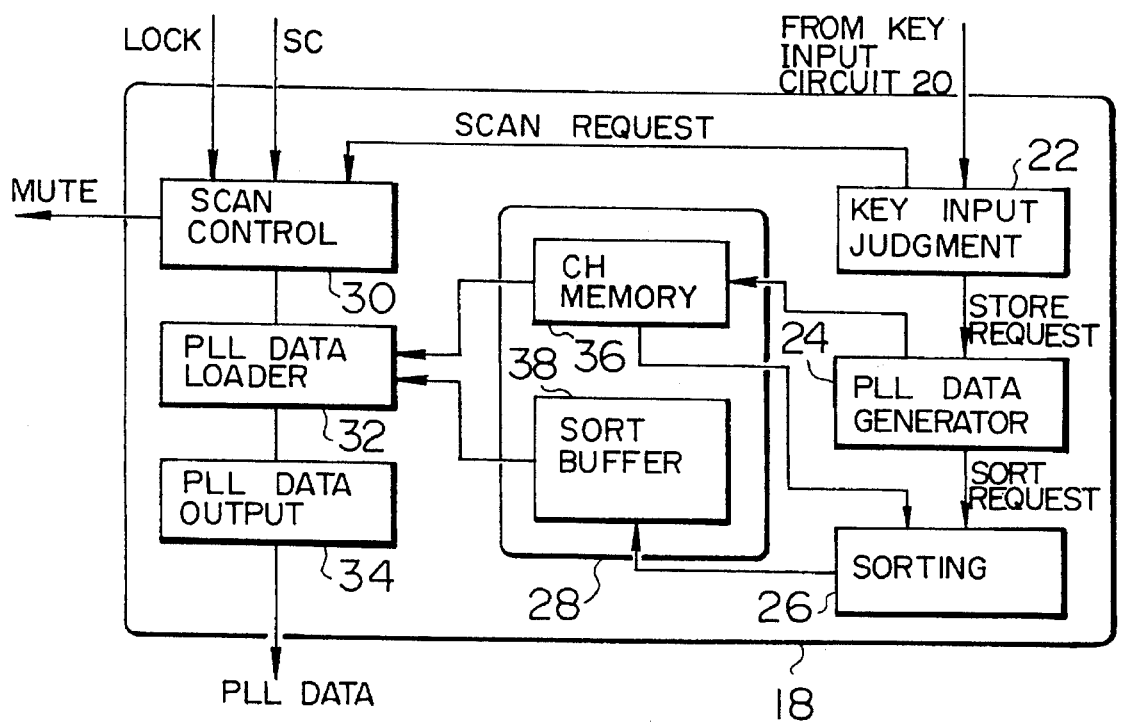
FIG. 10 is a block diagram showing another embodiment of the controller 18 of the scan receiving system depicted in FIG. 4.

FIG. 10 is a block diagram showing another embodiment of the controller 18. As shown in the drawing, the controller 18 is similar to the controller in the previous embodiment shown in FIG. 5, that is, the controller 18 in this embodiment is also constituted by a key input judgment means 22, a PLL data generator means 24, a sorting means 26, a memory means 28, a scan control means 30, a PLL data loader means 32 and a PLL data output means 34. The memory means 28 is constituted by channel memories 36 and sort buffers 38. This embodiment is however partly different from the embodiment of FIG. 5 in connection of the parts. That is, in this embodiment, sorting of frequencies is carried out when a frequency is stored in a channel, so that scanning is carried out on the basis of the result of sorting.

Figure 11:
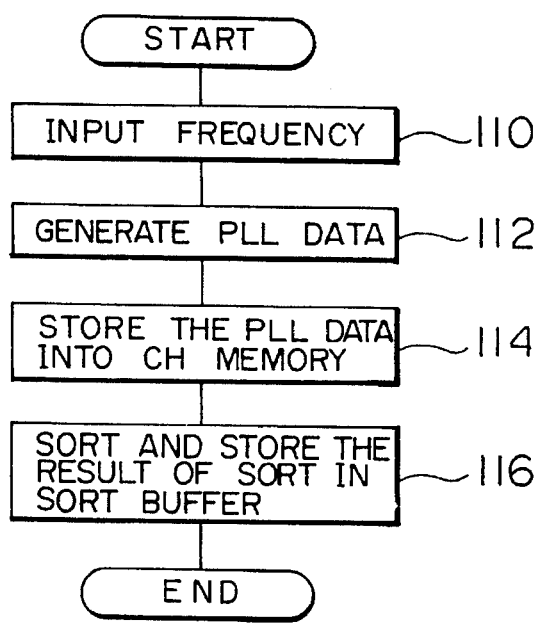
FIG. 11 is a flow chart showing the routine of registering PLL data into the channel memory 36 depicted in FIG. 10.
Figure 12:
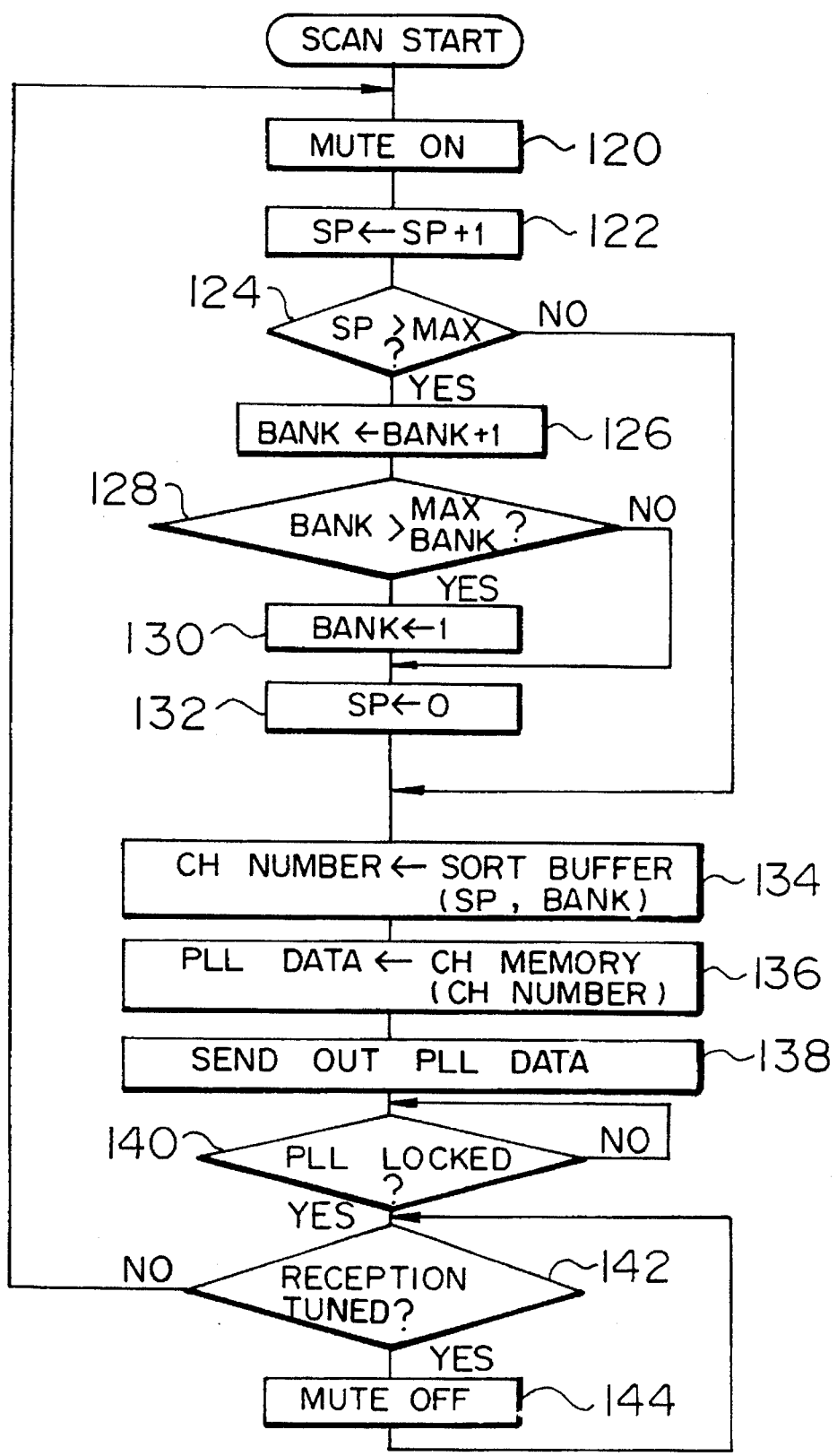
FIG. 12 is a flow chart showing the scanning operation in FIG. 10.

Referring to FIGS. 11, 12, 13 and 14, the operations of the respective means in the controller 18 will be described below in detail. FIG. 11 is a flow chart showing the routine of registering a frequency into a channel memory 36. FIG. 12 is a flow chart showing the scanning operation. FIG. 13 shows an example of data stored in the channel memories 36. FIG. 14 shows an example of data stored in the sort buffers 38.

(A) When a certain frequency is inputted through the key input circuit 20, the frequency registering routine shown in FIG. 11 starts (step 110). The key input judgment means 22 judges whether the frequency can be registered in one of the channel memories 36 or not. When a decision is made that the frequency can be registered, "PLL DATA" corresponding to the inputted frequency is generated by the PLL data generator means 24 (step 112). The "PLL DATA" is registered in the channel memory 36 of a vacant channel (step 114). The PLL data generator means 24 supplies a sort request signal to the sorting means 26.

(B) The sorting means 26 rearranges all the channels in a bank including the channel registered in the channel memory 36 to sort all the channels in the ascending order of frequencies and sets the respective channel numbers of all the channels in corresponding one of the sort buffers 38 in the order rearranged (step 116). That is, for example, as a result of sorting of the channel numbers CH1 to CH10 registered in the channel memories 36 in random frequency sequence as shown in FIG. 13, channel numbers are registered in the corresponding sort buffer 38 in frequency sequence as represented by BANK 1 shown in FIG. 14, that is, in the order of CH2 CH4 CH3 CH1 CH5 CH6 CH7 CH8 CH9 CH10. Thus, the frequency registering routine is terminated. The sort buffers 38 are provided in one-to-one correspondence with the banks.

(C) When a scan start instruction is inputted to the key input judgment means 22 through the key input circuit 20 (FIG. 4), the key input judgment means 22 transmits a scan request signal to the scan control means 30 so that the scanning operation starts.

(D) When scanning starts, the scan control means 30 turns on the "MUTE" signal supplied to the AF amplifier circuit 14 (FIG. 4) so that the audio output is stopped (step 120). Thereafter, the scan control means 30 increases the scan pointer by one point (step 122). In this occasion, a judgment is made as to whether the scan pointer is larger than the maximum (for example, 10 in the case of a system having 10 channels per one bank) (step 124). When the scan pointer is larger than the maximum, the bank number to be subjected to scanning is increased by one (step 126) because scanning of all the channels contained in the current bank is completed. In this occasion, a judgment is made as to whether the bank number exceeds its maximum or not (step 128). If the result of the judgment is YES, the bank number is initialized to BANK 1 (step 130) and then the scan pointer is initialized (step 132). If the result of the judgment in the step 124 is NO, the situation of the routine skips over the step 130 of bank number initialization to the step 132 of scan pointer initialization.

(E) On the other hand, the PLL data loader means 32 searches the sort buffer 38 for a channel number based on both the scan pointer and the bank number (step 134) and loads "PLL DATA" programmed in the channel memory 36 corresponding to the retrieved channel (step 136). The loaded "PLL DATA" is supplied to the RF reception circuit 12 (FIG. 4) through the PLL data output means 34 (step 138).

(F) A signal "LOCK" indicating the locking state of the PLL is continuously supplied from the RF reception circuit 12 (FIG. 4) to the scan control means 30, so that the information as to whether the PLL is locked or not is given by the signal "LOCK" (step 140).

(G) When the information that the PLL is locked is given by the signal "LOCK", the scan control means 30 detects the SC signal supplied from the RF reception circuit 12 (FIG. 4) and judges based on the SC signal whether reception is tuned to the reception reference frequency designated by the "PLL DATA" supplied to the PLL (step 142). When the information that reception is tuned is given by the SC signal, the scan control means 30 turns off the "MUTE" signal supplied to the AF amplifier circuit 14 (FIG. 4) so that the reception audio signal is outputted from the AF amplifier circuit (step 144).

(H) When reception is not tuned to the aforementioned reception reference frequency, the operation goes back to the step 120 in which the "MUTE" signal supplied to the AF amplifier circuit 14 (FIG. 4) is turned on so that the audio output is stopped. Thereafter, the scan pointer is increased by one point (step 122). If the scan pointer in this occasion is larger than the aforementioned maximum (step 124), the bank number to be subjected to scanning is increased by one (step 126) and then the scan pointer is initialized (step 132). Thereafter, the situation of the routine goes back to the aforementioned item (E). If the scan pointer is smaller than the maximum (step 124), the situation of the routine goes back directly to the aforementioned item (E).

Thereafter, by repeating a series of operations expressed by the items (E) to (H), all the channels contained in all the banks can be scanned in the ascending order of the frequencies.

This embodiment has the following advantages. That is, because the scanning operation is carried out on the basis of the result of sorting which is carried out whenever a desired frequency is programmed, the following advantages are achieved:

1. Channel numbers programmed by the user do not change;
2. Scanning speed is improved; and
3. The time required for sorting channel memories can be saved, so that VCO oscillation frequencies can be sorted in the ascending order of frequencies even in the case of a micro-computer which operates at a low speed. (Because a micro-computer generally operates at a low speed (at a low operation clock speed) for the double purpose of saving consumed electric power and reducing noise produced from the micro-computer in itself, it is difficult to carry out real-time processing requiring complex calculation in this case).

What is claimed is:

1. A scan receiving system comprising an antenna circuit, a radio-frequency reception circuit connected to said antenna circuit and for converting a received radio-frequency signal into an audio-frequency signal, an audio-frequency circuit connected to said radio-frequency reception circuit and for amplifying said audio-frequency signal supplied from said radio-frequency reception circuit, an input circuit for inputting a desired reception frequency, and a controller connected to said radio-frequency reception circuit, said audio-frequency circuit and said input circuit, said controller including a plurality of channel memories which are provided in one-to-one correspondence with a plurality of carrier frequency channels, a sort buffer connected to said controller, for storing a plurality of channel numbers that uniquely correspond to said plurality of channel memories, and wherein a plurality of desired reception frequencies inputted through said input circuit are programmed in said plurality of channel memories, said controller being operable to sort the plurality of channel numbers in said sort buffer in the order of frequency ascending in accordance with a scan instruction inputted through said input circuit to perform tuning to a reception signal in said radio-frequency reception circuit by successively using said programmed frequencies as reference values to thereby perform reception of a signal from a desired station, wherein said controller carries out the scanning operation while sorting the plurality of channel numbers in said sort buffer in the order of ascending reference oscillation frequencies.

2. A scan receiving system according to claim 1, wherein said controller further includes: an input judgment means for making a judgment, upon reception of a desired reception signal from said input circuit, as to whether said desired signal is to be registered into one of channel memories, for generating a storage request when a decision is made so that said desired reception frequency inputted from said input circuit is to be registered as a result of said judgment, and for generating a scan request upon reception of a scan instruction from said input circuit; a PLL data generating means for generating PLL data corresponding to said desired reception frequency in response to said storage request and for registering said PLL data in one of said channel memories; a scan control means supplied with a PLL lock signal and a squelch control signal from said radio-frequency reception circuit for scanning said channel memories in response to said scan request and for generating a sort request, said scan control means turning off a MUTE signal to be given to said audio-frequency circuit when tuning to a reception signal is obtained in said radio-frequency reception circuit, said scan control means turning on said MUTE signal when tuning is not obtained in said radio-frequency reception circuit; a sorting means for sorting said channel memories in response to said sort request and for registering a result of said sorting in a sort buffer; a PLL data loading means for loading said PLL data registered in said channel memories in accordance with said desired reception frequency on the basis of a result of said scanning and a result of said sorting; and a PLL data output means for transferring said loaded PLL data to said radio-frequency reception circuit.

3. A scan receiving system according to claim 1, wherein said controller performs sorting of the channel numbers in said sort buffer in the order of frequency ascending whenever one of said plurality of desired reception frequencies is programmed, and said controller carries out the scanning operation on the basis of a result of said sorting.

4. A scan receiving system according to claim 3, wherein said controller further includes: an input judgment means for making a judgment, upon reception of a desired reception signal from said input circuit, as to whether said desired signal is to be registered into one of channel memories, for generating a storage request when a decision is made so that said desired reception frequency inputted from said input circuit is to be registered as a result of said judgment, and for generating a scan request upon reception of a scan instruction from said input circuit; a PLL data generating means for generating PLL data corresponding to said desired reception frequency in response to said storage request, for registering said PLL data in one of said channel memories, and for generating a sort request; a sorting means for sorting said channel memories in response to said sort request and for registering a result of said sorting in a sort buffer; a scan control means supplied with a PLL lock signal and a squelch control signal from said radio-frequency reception circuit for scanning said channel memories in response to said scan request, said scan control means turning off a MUTE signal to be given to said audio-frequency circuit when tuning to a reception signal is obtained in said radio-frequency reception circuit, said scan control means turning on said MUTE signal when tuning is not obtained in said radio-frequency reception circuit; a PLL data loading means for loading said PLL data registered in said channel memories in accordance with said desired reception frequency on the basis of a result of said scanning and a result of said sorting; and a PLL data output means for transferring said loaded PLL data to said radio-frequency reception circuit.

5. A scan receiving system comprising an antenna circuit, a radio-frequency reception circuit connected to said antenna circuit and for converting a received radio-frequency signal into an audio-frequency signal, an audio-frequency circuit connected to said radio-frequency reception circuit and for amplifying said audio-frequency signal supplied from said radio-frequency reception circuit, an input circuit for inputting a desired reception frequency, and a controller connected to said radio-frequency reception circuit, said audio-frequency circuit and said input circuit, said controller including a plurality of channel memories which are provided in one-to-one correspondence with a plurality of carrier frequency channels, a sort buffer connected to said controller, for storing a plurality of channel numbers that uniquely correspond to said plurality of channel memories, and wherein a plurality of desired reception frequencies inputted through said input circuit are programmed in said plurality of channel memories, said controller being operable to sort the plurality of channel numbers in said sort buffer in the order of frequency descending in accordance with a scan instruction inputted through said input circuit to perform tuning to a reception signal in said radio-frequency reception circuit by successively using said programmed frequencies as reference values to thereby perform reception of a signal from a desired station, wherein said controller carries out the scanning operation while sorting the plurality of channel numbers in said sort buffer in the order of descending reference oscillation frequencies.

6. A scan receiving system according to claim 5, wherein said controller further includes: an input judgment means for making a judgment, upon reception of a desired reception signal from said input circuit, as to whether said desired signal is to be registered into one of channel memories, for generating a storage request when a decision is made so that said desired reception frequency inputted from said input circuit is to be registered as a result of said judgment, and for generating a scan request upon reception of a scan instruction from said input circuit; a PLL data generating means for generating PLL data corresponding to said desired reception frequency in response to said storage request and for registering said PLL data in one of said channel memories; a scan control means supplied with a PLL lock signal and a squelch control signal from said radio-frequency reception circuit for scanning said channel memories in response to said scan request and for generating a sort request, said scan control means turning off a MUTE signal to be given to said audio-frequency circuit when tuning to a reception signal is obtained in said radio-frequency reception circuit, said scan control means turning on said MUTE signal when tuning is not obtained in said radio-frequency reception circuit; a sorting means for sorting said channel memories in response to said sort request and for registering a result of said sorting in a sort buffer; a PLL data loading means for loading said PLL data registered in said channel memories in accordance with said desired reception frequency on the basis of a result of said scanning and a result of said sorting; and a PLL data output means for transferring said loaded PLL data to said radio-frequency reception circuit.

7. A scan receiving system according to claim 5, wherein said controller performs sorting of the channel numbers in said sort buffer in the order of frequency descending whenever one of said plurality of desired reception frequencies is programmed, and said controller carries out the scanning operation on the basis of a result of said sorting.

8. A scan receiving system according to claim 7, wherein said controller further includes: an input judgment means for making a judgment, upon reception of a desired reception signal from said input circuit, as to whether said desired signal is to be registered into one of channel memories, for generating a storage request when a decision is made so that said desired reception frequency inputted from said input circuit is to be registered as a result of said judgment, and for generating a scan request upon reception of a scan instruction from said input circuit; a PLL data generating means for generating PLL data corresponding to said desired reception frequency in response to said storage request, for registering said PLL data in one of said channel memories, and for generating a sort request; a sorting means for sorting said channel memories in response to said sort request and for registering a result of said sorting in a sort buffer; a scan control means supplied with a PLL lock signal and a squelch control signal from said radio-frequency reception circuit for scanning said channel memories in response to said scan request, said scan control means turning off a MUTE signal to be given to said audio-frequency circuit when tuning to a reception signal is obtained in said radio-frequency reception circuit, said scan control means turning on said MUTE signal when tuning is not obtained in said radio-frequency reception circuit; a PLL data loading means for loading said PLL data registered in said channel memories in accordance with said desired reception frequency on the basis of a result of said scanning and a result of said sorting; and a PLL data output means for transferring said loaded PLL data to said radio-frequency reception circuit.

\* \* \* \* \*